US008973951B2

(12) United States Patent
Nicewicz et al.

(10) Patent No.: US 8,973,951 B2
(45) Date of Patent: Mar. 10, 2015

(54) ADJUSTABLE VERTICAL EXHAUST DUCT

(75) Inventors: Andrzej Nicewicz, Wilmette, IL (US); Samuel J. Adducci, Palos Heights, IL (US); Alva B. Eaton, Nottingham Park, IL (US); Samuel M. Marrs, Bradley, IL (US); Max W. Hibner, Glenview, IL (US)

(73) Assignee: Panduit Corp., Tinley Park, IL (US)

( * ) Notice: Subject to any disclaimer, the term of this patent is extended or adjusted under 35 U.S.C. 154(b) by 878 days.

(21) Appl. No.: 12/817,741

(22) Filed: Jun. 17, 2010

(65) Prior Publication Data
US 2011/0000574 A1 Jan. 6, 2011

Related U.S. Application Data

(60) Provisional application No. 61/222,528, filed on Jul. 2, 2009.

(51) Int. Cl.
*H05K 7/20* (2006.01)

(52) U.S. Cl.
CPC .................. *H05K 7/20745* (2013.01)
USPC ........ 285/303; 285/145.1; 285/424; 361/690; 361/695; 454/184

(58) Field of Classification Search
USPC ........... 285/145.1, 298, 303, 330, 424, 124.1, 285/414
See application file for complete search history.

(56) References Cited

U.S. PATENT DOCUMENTS

| | | | |
|---|---|---|---|
| 831,429 A | 9/1906 | Harrington | |
| 1,484,491 A * | 2/1924 | Gutermann | 285/406 |
| 3,192,306 A | 6/1965 | Skonnord | |
| 3,730,566 A * | 5/1973 | Kazmierski et al. | 285/229 |
| 3,827,342 A | 8/1974 | Hughes | |
| 3,842,561 A | 10/1974 | Wong | |
| 3,930,641 A | 1/1976 | Overmyer et al. | |
| 4,077,434 A * | 3/1978 | Sieckert et al. | 138/92 |
| 4,347,782 A | 9/1982 | Hoecke | |
| 4,357,860 A | 11/1982 | Krzak | |
| 4,480,859 A * | 11/1984 | Rueckl et al. | 285/145.1 |
| 4,522,191 A | 6/1985 | Knowles et al. | |
| 4,543,677 A | 10/1985 | Haglund et al. | |
| 4,633,766 A * | 1/1987 | Nation et al. | 454/370 |

(Continued)

FOREIGN PATENT DOCUMENTS

| | | |
|---|---|---|
| DE | 432098 | 8/1926 |
| DE | 2509487 A1 | 9/1976 |

(Continued)

OTHER PUBLICATIONS

Rack Technologies 2005 cabinet accessories catalog p. 6.1 and 6.7 (2 pages).

(Continued)

*Primary Examiner* — James Hewitt
(74) *Attorney, Agent, or Firm* — Christopher S. Clancy; James H. Williams

(57) ABSTRACT

A vertical exhaust duct for an electronic equipment enclosure is provided. The vertical exhaust duct includes a first duct section, a second duct section slidably connected to the first duct section and extendable to a first height above the first duct section, and a third duct section slidably connected to the second duct section and extendable to a second height above the second duct section.

13 Claims, 18 Drawing Sheets

(56) References Cited

U.S. PATENT DOCUMENTS

| | | | |
|---|---|---|---|
| 4,638,563 A | 1/1987 | Buniff |
| 4,865,013 A | 9/1989 | Teakell |
| 5,292,282 A | 3/1994 | Callas |
| 5,294,748 A | 3/1994 | Schwenk et al. |
| 5,515,655 A | 5/1996 | Hoffmann |
| 5,653,631 A | 8/1997 | Andersen et al. |
| 5,671,805 A | 9/1997 | Ståhl et al. |
| 5,791,980 A | 8/1998 | Kramer, Jr. |
| 5,873,556 A | 2/1999 | Reiker |
| 5,941,767 A | 8/1999 | Fukuda |
| 5,979,854 A | 11/1999 | Lundgren et al. |
| 5,995,368 A | 11/1999 | Lee et al. |
| 5,997,117 A | 12/1999 | Krietzman |
| 6,034,873 A | 3/2000 | Ståhl et al. |
| 6,185,098 B1 | 2/2001 | Benavides |
| 6,383,242 B1 | 5/2002 | Rogers et al. |
| 6,412,292 B2 | 7/2002 | Spinazzola et al. |
| 6,418,010 B1 | 7/2002 | Sawyer |
| 6,521,835 B1 | 2/2003 | Walsh |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,575,656 B2 | 6/2003 | Suh |
| 6,592,448 B1 | 7/2003 | Williams |
| 6,616,524 B2 | 9/2003 | Storck, Jr. et al. |
| 6,669,552 B1 | 12/2003 | Beer |
| 6,672,955 B2 | 1/2004 | Charron |
| 6,722,151 B2 | 4/2004 | Spinazzola et al. |
| 6,745,579 B2 | 6/2004 | Spinazzola et al. |
| 6,766,832 B2 | 7/2004 | DiMarco |
| 6,854,284 B2 | 2/2005 | Bash et al. |
| 6,867,967 B2 | 3/2005 | Mok |
| 6,949,050 B2 | 9/2005 | Takatori et al. |
| 7,137,772 B2 | 11/2006 | Blateri |
| 7,236,362 B2 | 6/2007 | Wang et al. |
| 7,255,640 B2 | 8/2007 | Aldag et al. |
| 7,372,695 B2 | 5/2008 | Coglitore et al. |
| 7,406,978 B2 | 8/2008 | Mintie et al. |
| 7,438,638 B2 | 10/2008 | Lewis, II et al. |
| 7,452,287 B2 | 11/2008 | Erickson et al. |
| 7,470,176 B2 | 12/2008 | Morris et al. |
| 7,500,911 B2 | 3/2009 | Johnson |
| 2003/0116213 A1 | 6/2003 | Dimarco |
| 2004/0099747 A1 | 5/2004 | Johnson et al. |
| 2005/0054282 A1 | 3/2005 | Green et al. |
| 2005/0225936 A1 | 10/2005 | Day |
| 2006/0199503 A1 | 9/2006 | Wang |
| 2006/0278215 A1 | 12/2006 | Gagas et al. |
| 2007/0064389 A1 | 3/2007 | Lewis, II et al. |
| 2007/0064391 A1 | 3/2007 | Lewis, II et al. |
| 2007/0220846 A1 | 9/2007 | Ray |
| 2008/0029081 A1 | 2/2008 | Gagas et al. |
| 2008/0068791 A1 | 3/2008 | Ebermann |
| 2008/0316702 A1 | 12/2008 | Donowho et al. |
| 2008/0316703 A1 | 12/2008 | Donowho et al. |
| 2009/0190307 A1 | 7/2009 | Krietzman |
| 2009/0239461 A1 | 9/2009 | Lewis, II et al. |
| 2010/0061059 A1 | 3/2010 | Krietzman et al. |

FOREIGN PATENT DOCUMENTS

| | | | |
|---|---|---|---|
| DE | 19827681 A1 | 12/1999 |
| JP | 2000286580 A | 10/2000 |
| WO | 9106725 A1 | 5/1991 |
| WO | 9963797 A1 | 12/1999 |

OTHER PUBLICATIONS

Chatsworth Products, Inc. Vertical Exhaust Duct System for F-Series Teraframe™ Cabinet System Product Information Sheet, Aug. 2008 (one page).

Chatsworth Products, Inc. Vertical Exhaust Duct System for F-Series Teraframe™ Cabinet System Product Information Sheet, Jan. 2009 (one page).

Hewlett-Packard 10000 G2 42U Rack Air Duct Installation Guide, Aug. 2008, (23 pages).

Hewlett-Packard 10000 G2 Rack Air Duct Kit Overview & Features webpage, Mar. 25, 2010 (1 page).

* cited by examiner

ADJUSTABLE VERTICAL EXHAUST DUCT

CROSS REFERENCE TO RELATED APPLICATIONS

This application claims priority to U.S. Provisional Patent Application No. 61/222,528, filed on Jul. 2, 2009, which is incorporated by reference in its entirety.

BACKGROUND OF THE INVENTION

The present invention relates to an adjustable vertical exhaust duct. More particularly, the present invention relates to an adjustable vertical exhaust duct for a network cabinet in a data center room.

Existing vertical exhaust ducts channel hot air from the network cabinet into an exhaust air plenum in the data center room. However, network cabinets and exhaust air plenums are available in different heights, potentially leaving a vertical gap between the network cabinet and the exhaust air plenum. Additionally, the same size vertical exhaust duct is typically used for network cabinets of various widths, such as 24, 28, or 32 inches, potentially leaving a horizontal gap between adjacent vertical exhaust ducts.

Therefore, there is a need for an adjustable vertical exhaust duct that will accommodate the vertical gap between server cabinets and exhaust air plenums in a data center room. Additionally, there is a need for an adjustable vertical exhaust duct that will accommodate the horizontal gap between adjacent vertical exhaust ducts.

SUMMARY OF THE INVENTION

Certain embodiments of the present invention provide a vertical exhaust duct for an electronic equipment enclosure. The vertical exhaust duct includes a first duct section, a second duct section slidably connected to the first duct section and extendable to a first height above the first duct section, and a third duct section slidably connected to the second duct section and extendable to a second height above the second duct section.

In certain embodiments of the present invention, the first duct section includes a first plurality of elongated openings for securing the second duct section to the first duct section at the first height and the second duct section includes a second plurality of elongated openings for securing the third duct section to the second duct section at the second height.

In certain embodiments of the present invention, at least one of the first duct section and the second duct section includes at least one first fastener for securing the second duct section to the first duct section at the first height and at least one of the second duct section and the third duct section includes at least one second fastener for securing the third duct section to the second duct section at the second height.

Certain embodiments of the present invention provide a vertical exhaust duct for an electronic equipment enclosure. The vertical exhaust duct includes a first duct section, a second duct section slidably connected to the first duct section and extendable to a height above the first duct section, and a first side flange slidably connected to the second duct section and extendable to a first position adjacent a first side of the second duct section for sealing a first gap between the vertical exhaust duct and a first adjacent vertical exhaust duct.

Certain embodiments of the present invention provide a vertical exhaust duct for an electronic equipment enclosure. The vertical exhaust duct includes a duct section and a flange slidably connected to the duct section and extendable to a position adjacent a side of the duct section for sealing a gap between the vertical exhaust duct and an adjacent vertical exhaust duct.

DETAILED DESCRIPTION

Figure 1:
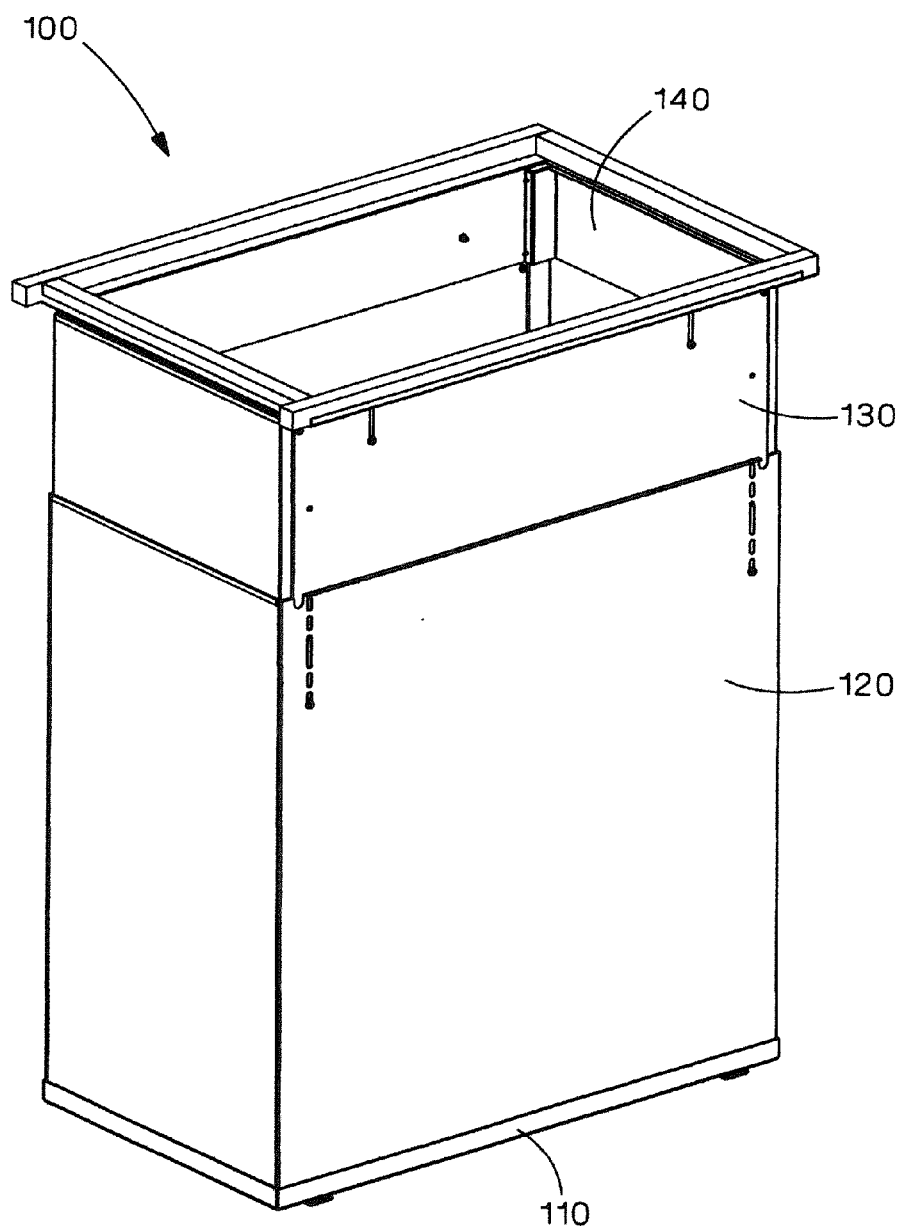
FIG. 1 is a perspective view of an adjustable vertical exhaust duct in accordance with an embodiment of the present invention, wherein the exhaust duct is shown in a retracted vertical position.

FIGS. 1-18 illustrate an adjustable vertical exhaust duct 100 for a network cabinet in a data center room. Exhaust duct 100 will channel hot air from the network cabinet into an exhaust air plenum in the data center room. Network cabinets and exhaust air plenums come in different heights, potentially leaving a vertical gap between the network cabinets and the exhaust air plenums. Also, the same size exhaust duct 100 is typically used for network cabinets of different widths, such as 24, 28, or 32 inches, potentially leaving a horizontal gap 20

(see FIG. 17) between adjacent exhaust ducts. However, exhaust duct 100 can accommodate these gaps.

Exhaust duct 100 includes a duct bottom 110, an outer duct section 120, an inner duct section 130, and a top collar 140.

FIG. 1 shows exhaust duct 100 in a retracted vertical position (e.g., inner duct section 130 and top collar 140 in retracted vertical positions). In the retracted vertical position, exhaust duct 100 is preferably about 42 inches high.

Figure 2:
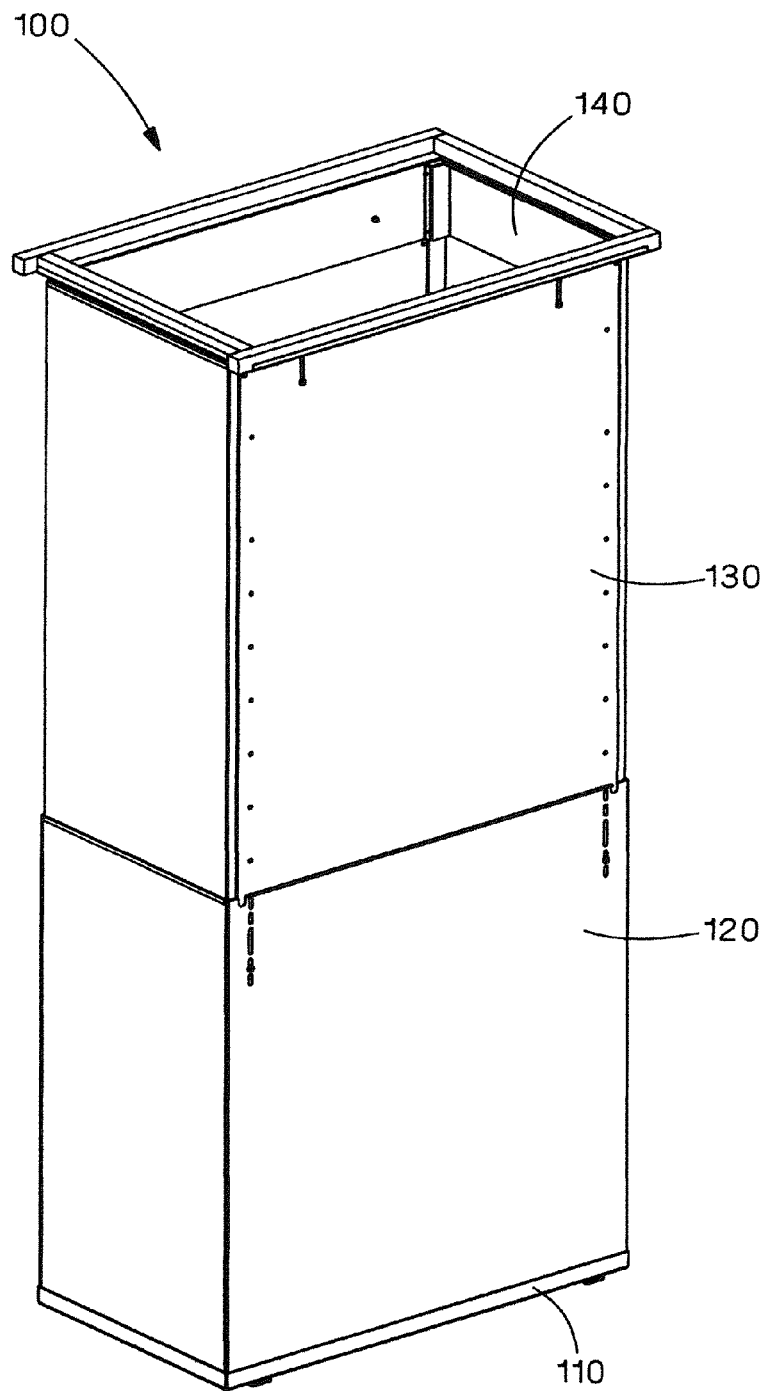
FIG. 2 is a perspective view of the adjustable vertical exhaust duct of FIG. 1, wherein the exhaust duct is shown in a partially extended vertical position.

FIG. 2 shows exhaust duct 100 in a partially extended vertical position (e.g., inner duct section 130 in an extended vertical position and top collar 140 in a retracted vertical position). In the partially extended vertical position, exhaust duct 100 is preferably about 68 inches high.

Figure 3:
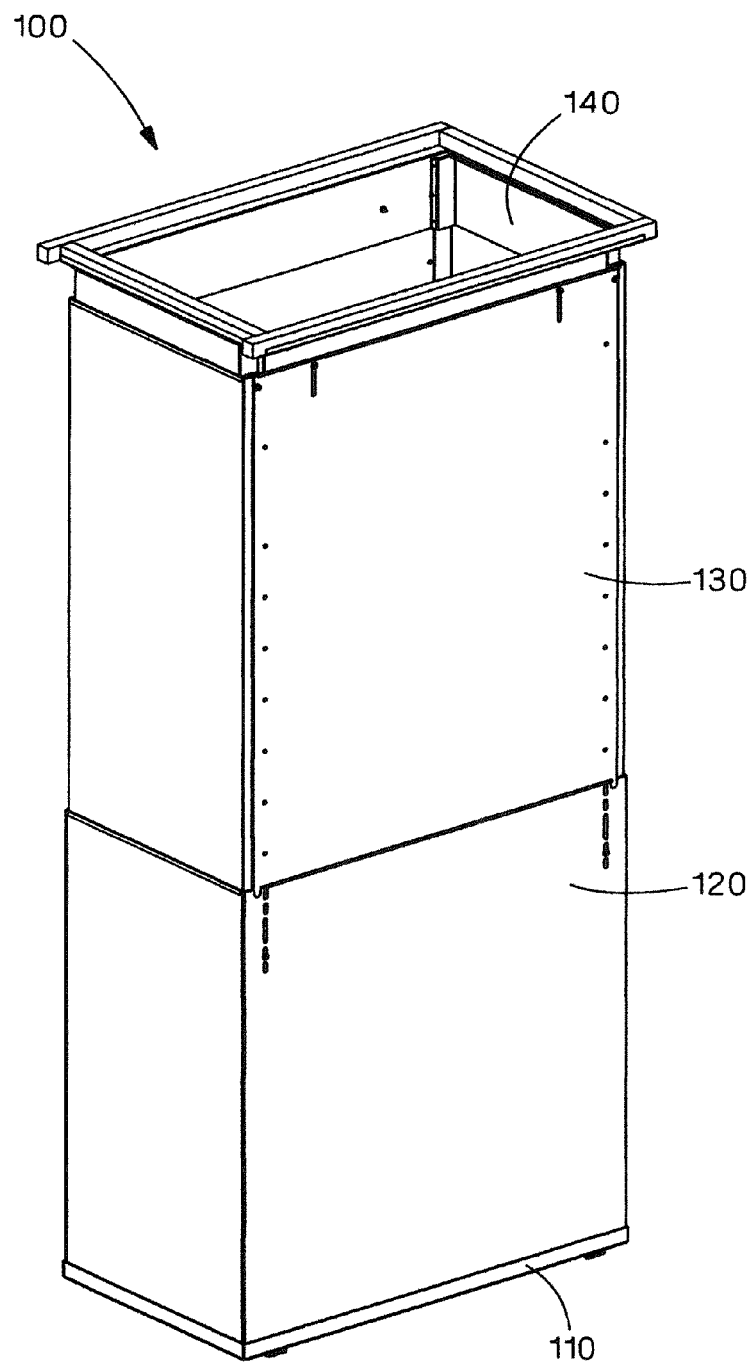
FIG. 3 is a perspective view of the adjustable vertical exhaust duct of FIG. 1, wherein the exhaust duct is shown in a fully extended vertical position.

FIG. 3 shows exhaust duct 100 in a fully extended vertical position (e.g., inner duct section 130 and top collar 140 in extended vertical positions). In the fully extended vertical position, exhaust duct 100 is preferably about 70 inches high.

As described above, FIG. 1 shows inner duct section 130 in the retracted vertical position, and FIGS. 2 and 3 show inner duct section 130 in the extended vertical position. Preferably, inner duct section 130 is smaller than outer duct section 120, and inner duct section 130 telescopes to adjust the height of exhaust duct 100. That is, adjustable or telescoping inner duct section 130 provides for "coarse" adjustment of exhaust duct height, for example, from about 42 inches high to about 68 inches high.

Figure 6:
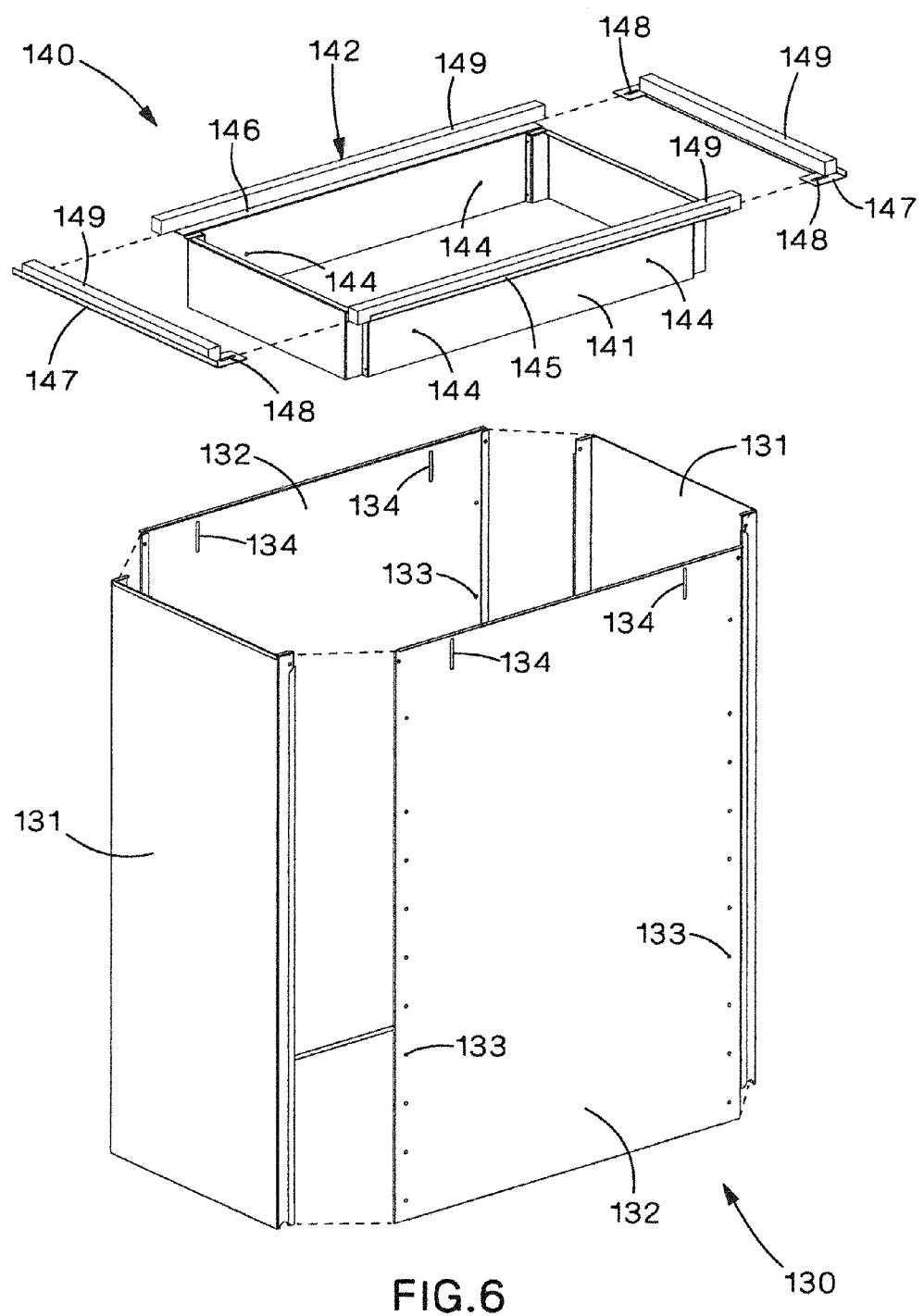
FIG. 6 is an exploded view of the adjustable vertical exhaust duct of FIG. 3, showing the components of the inner duct section and the top collar.

Additionally, as described above, FIGS. 1 and 2 show top collar 140 in the retracted vertical position, and FIG. 3 shows top collar 140 in the extended vertical position. As best seen in FIG. 6, top collar 140 includes a bottom flange 141 and a top flange 142. Preferably, bottom flange 141 is smaller than inner duct section 130, and top collar 140 telescopes to adjust the height of exhaust duct 100. That is, adjustable or telescoping top collar 140 provides for "fine" adjustment of exhaust duct height, for example, from about 68 inches high to about 70 inches high.

Figure 4:
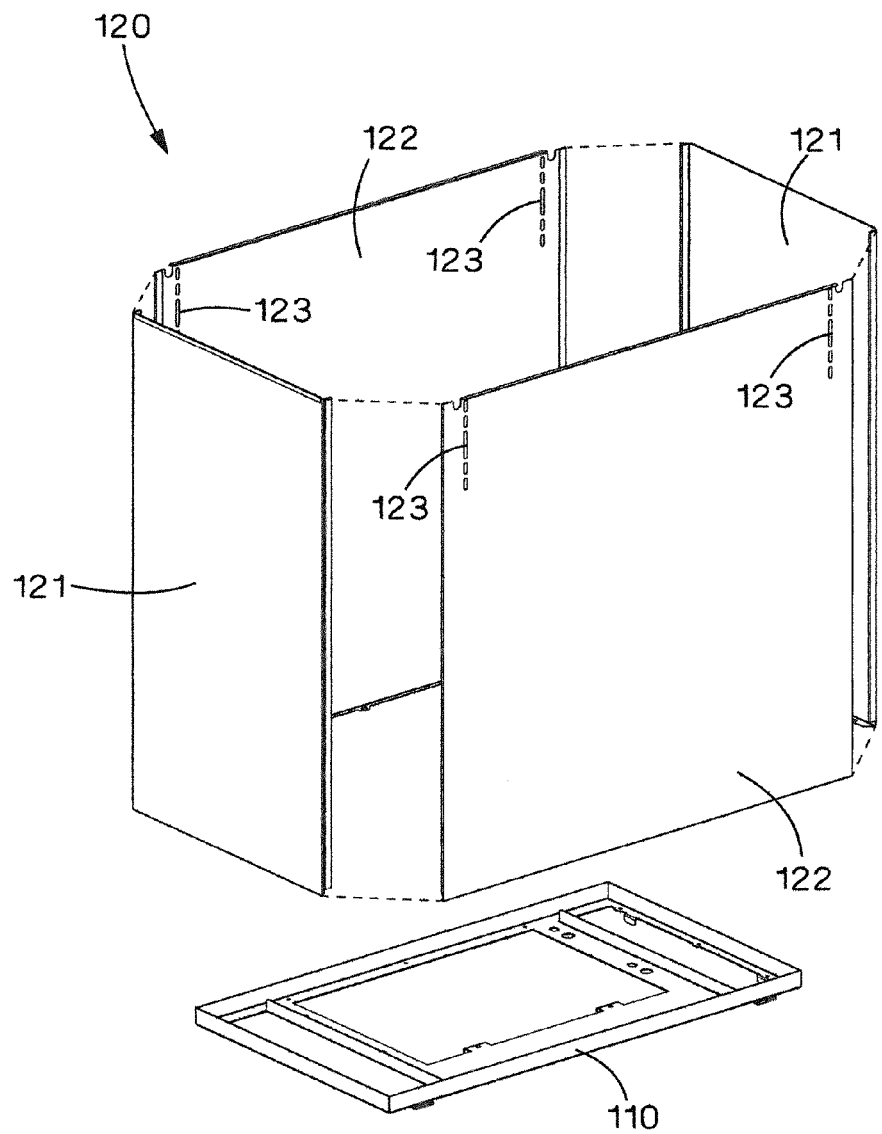
FIG. 4 is an exploded view of the adjustable exhaust duct of FIG. 3, showing the components of the duct bottom and the outer duct section.
Figure 5:
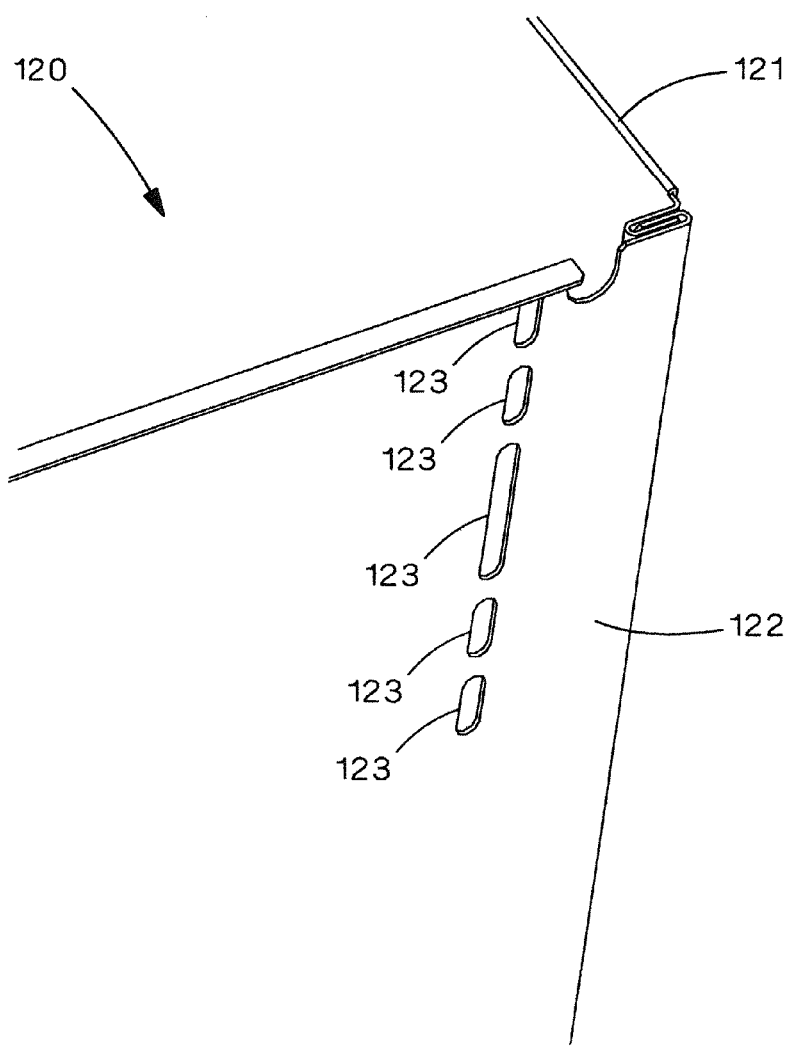
FIG. 5 is a detailed view of a portion of the outer duct section of FIG. 4, after the outer duct section is assembled.

FIG. 4 shows the formed pieces of outer duct section 120. Outer duct section 120 includes two end panels 121 and two side panels 122. As shown in FIG. 5, end panels 121 and side panels 122 hook together at the corners using open hems on each piece. End panels 121 and side panels 122 are secured to duct bottom 110.

FIG. 6 shows the formed pieces of inner duct section 130. Inner duct section 130 includes two end panels 131 and two side panels 132. Similar to outer duct section 120 (see FIG. 5), end panels 131 and side panels 132 hook together at the corners using open hems on each piece and are held together with threaded fasteners.

Figure 7:
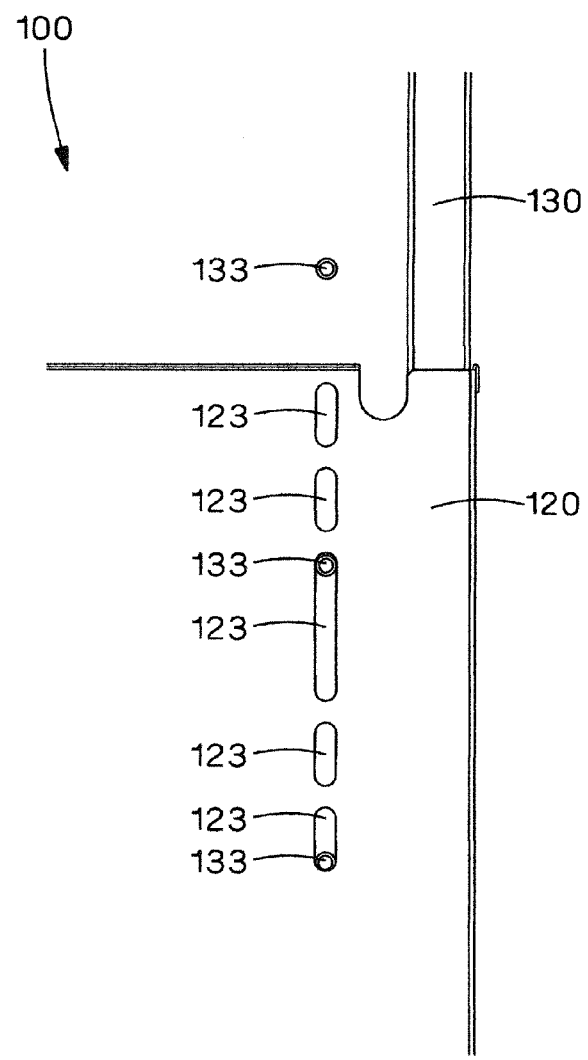
FIG. 7 is a detailed view of one of the locking systems of the adjustable vertical exhaust duct of FIG. 2, wherein four identical nut, screw, and slot locking systems secure the inner duct section to the outer duct section.

Outer duct section 120 includes a plurality of slots 123. Preferably, each slot 123 is configured to provide infinite adjustability. For example, as best seen in FIG. 7, one slot is longer than the other slots. Inner duct section 130 includes a plurality of apertures having a plurality of nuts 133. Preferably, each aperture is identical and each nut 133 is an insertion hardware nut, such as a PEM nut. As shown in FIG. 7, slots 123 in outer duct section 120 align with nuts 133 in inner duct section 130 and screws hold outer and inner duct sections 120, 130 together at the desired height. The screws may include paint piercing washers to ground outer and inner duct sections 120, 130 together. Also, outer duct section 120 overlaps inner duct section 130 to cover each slot 123 and prevent air leakage.

Figure 8:
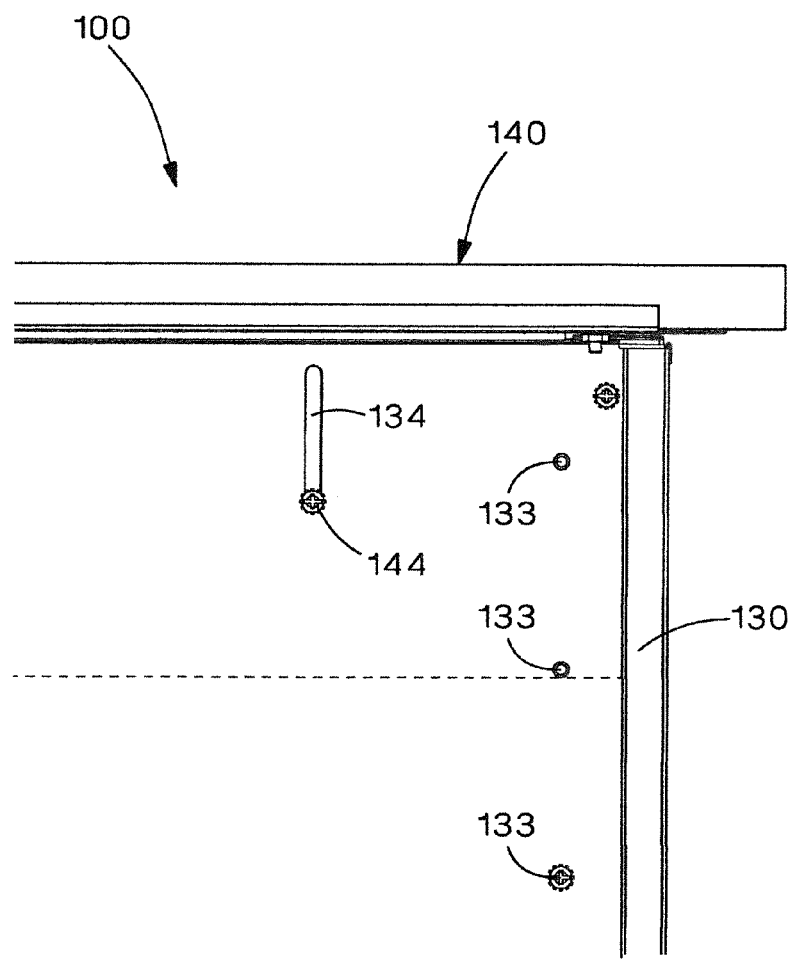
FIG. 8 is a detailed view of one of the locking systems of the adjustable vertical exhaust duct of FIG. 2, wherein four identical nut, screw, and slot locking systems secure the top collar to the inner duct section.
Figure 9:
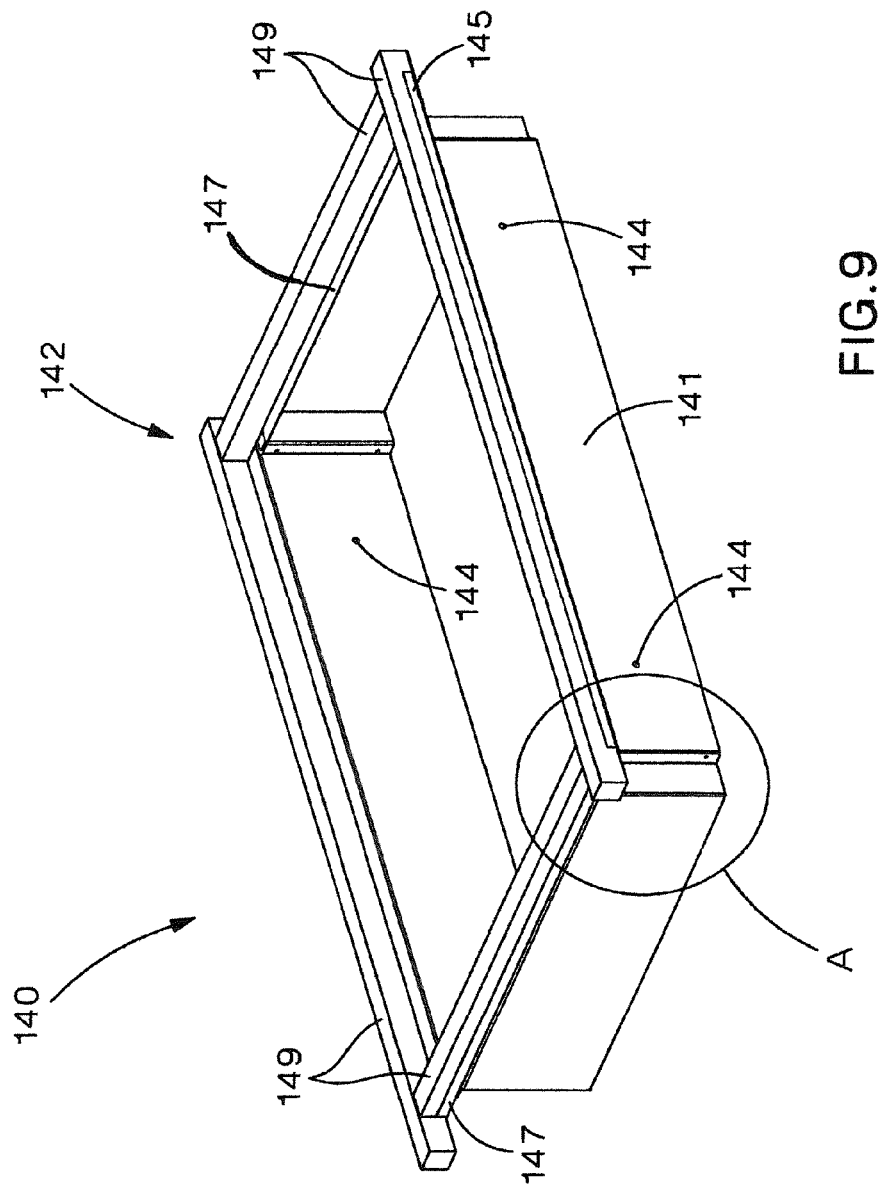
FIG. 9 is a perspective view of the top collar of FIG. 3, wherein the top collar is in a retracted horizontal position.
Figure 10:
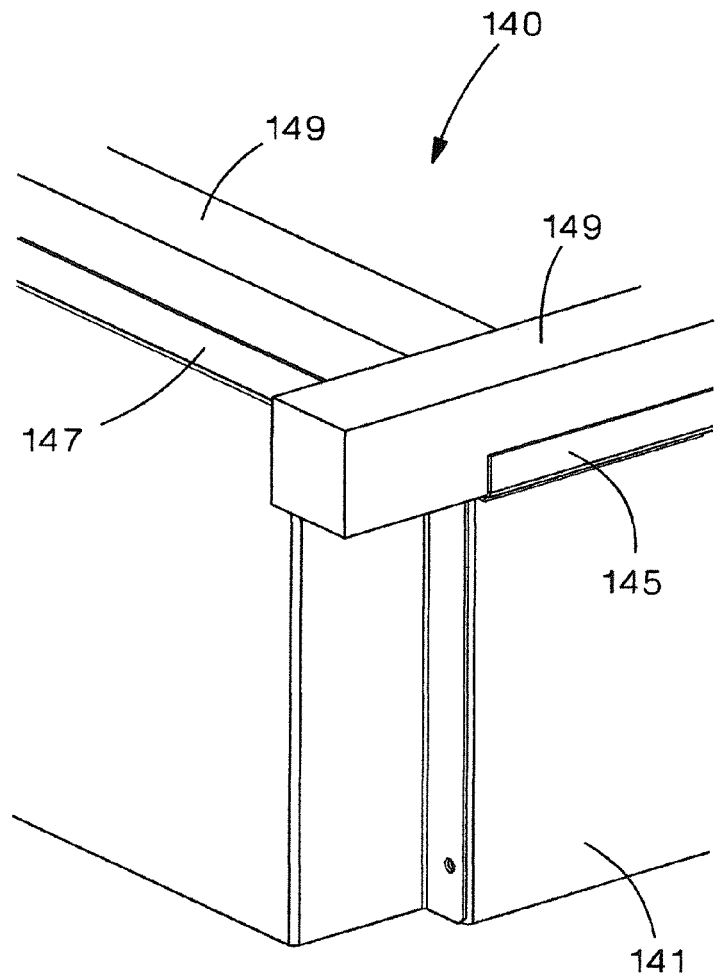
FIG. 10 is a detailed view of section A of FIG. 9.
Figure 11:
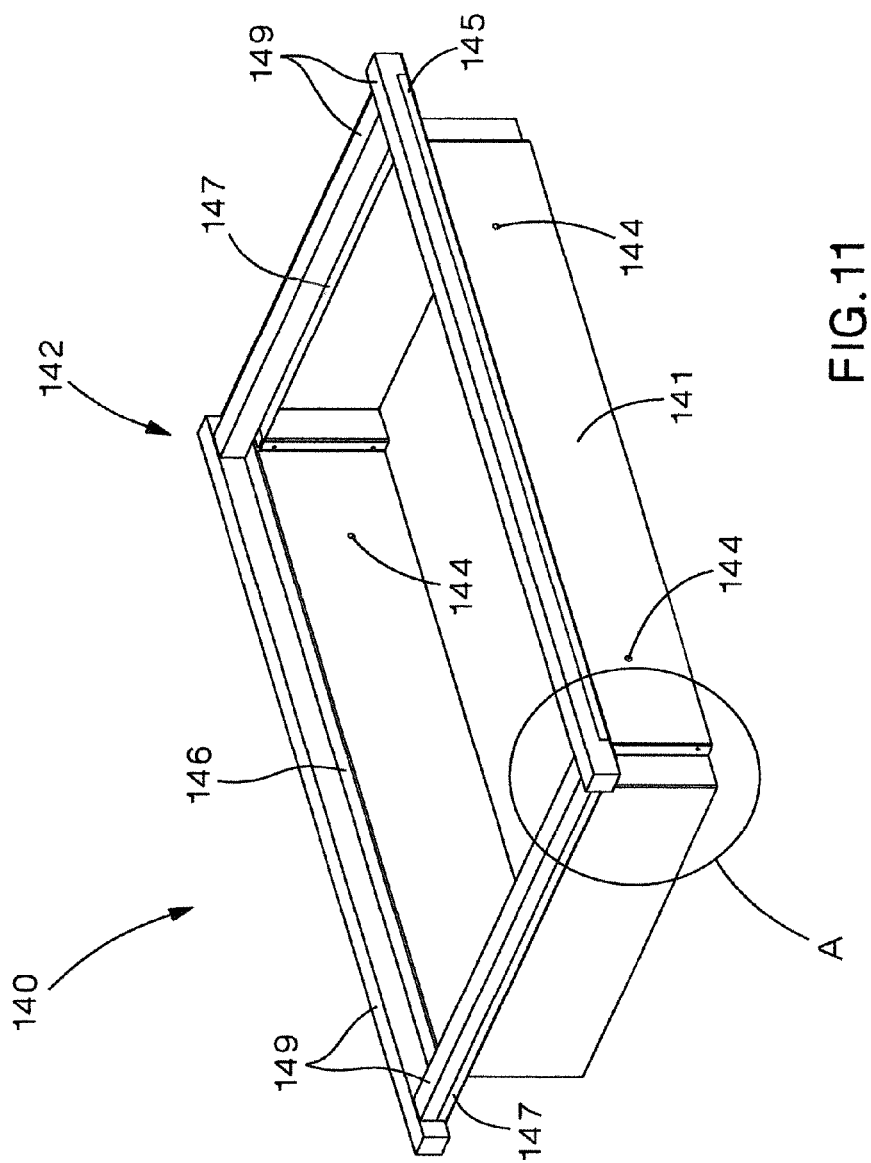
FIG. 11 is a perspective view of the top collar of FIG. 3, wherein the top collar is in an extended horizontal position.
Figure 12:
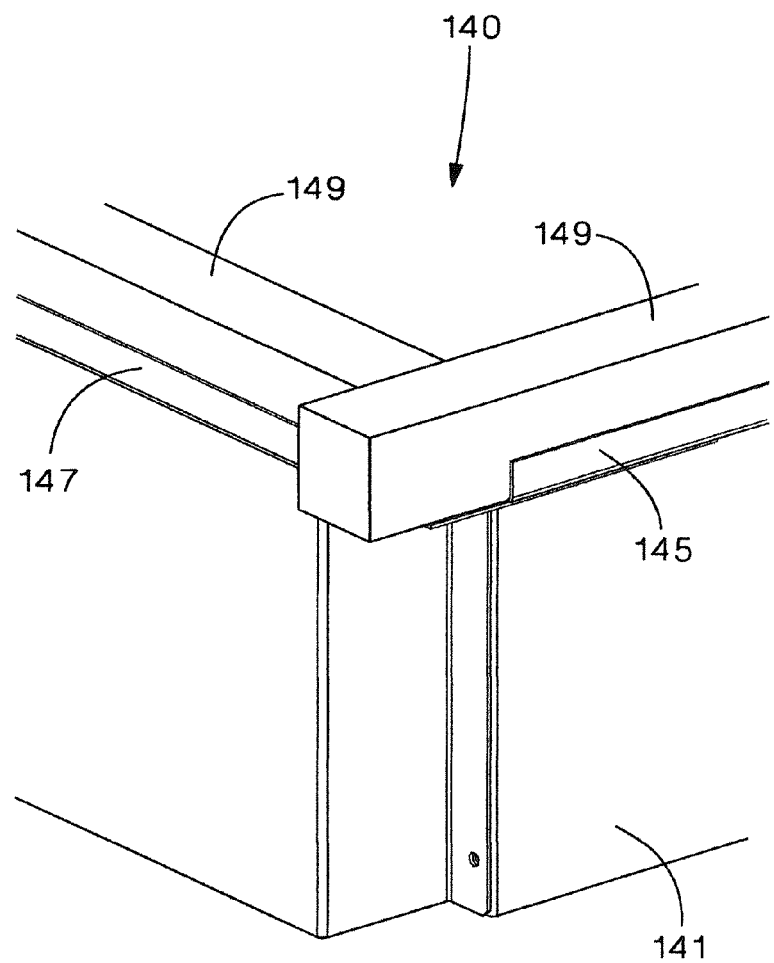
FIG. 12 is a detailed view of section A of FIG. 11.

Similarly, inner duct section 130 includes a plurality of slots 134. Preferably, each slot 134 is identical. Top collar 140 includes a plurality of apertures having a plurality of nuts 144. Preferably, each aperture is identical and each nut 144 is an insertion hardware nut, such as a PEM nut. As shown in FIG. 8, slots 134 in inner duct section 130 align with nuts 144 in top collar 140 and screws hold inner duct section 130 and top collar 140 together at a desired height. The screws may include paint piercing washers to ground inner duct section 130 and top collar 140 together. Also, inner duct section 130 overlaps top collar 140 to cover each slot 134 and prevent air leakage.

Referring again to FIG. 6, top flange 142 includes a front flange 145, a back flange 146, and two side flanges 147. Front and back flanges 145, 146 are integrally formed with bottom flange 141, but it is likewise contemplated that front and back flanges 145, 146 may be removably connected to bottom flange 141. Side flanges 147 are slidably connected to front and back flanges 145, 146, for example, via slots 148 and fasteners (not shown), allowing side flanges 147 to slide from the retracted horizontal position (see FIGS. 9 and 10) to the extended horizontal position (see FIGS. 11 and 12). Additionally, top flange 142, and more particularly, front, back, and side flanges 145-147, may include one or more gaskets 149, such as foam and/or rubber gaskets, that will press against the exhaust air plenum to ensure that hot air is evacuated from the network cabinet and channeled into the exhaust air plenum.

Figure 13:
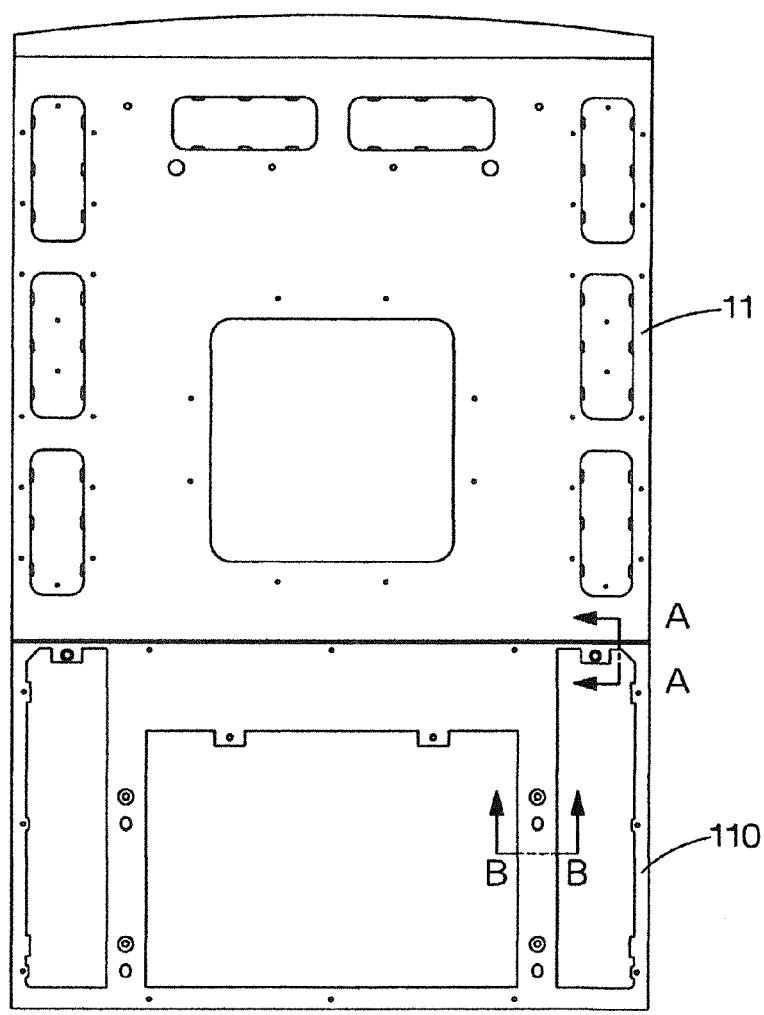
FIG. 13 is a top view of the duct bottom of FIG. 4 attached to a top cap of a network cabinet.
Figure 14:
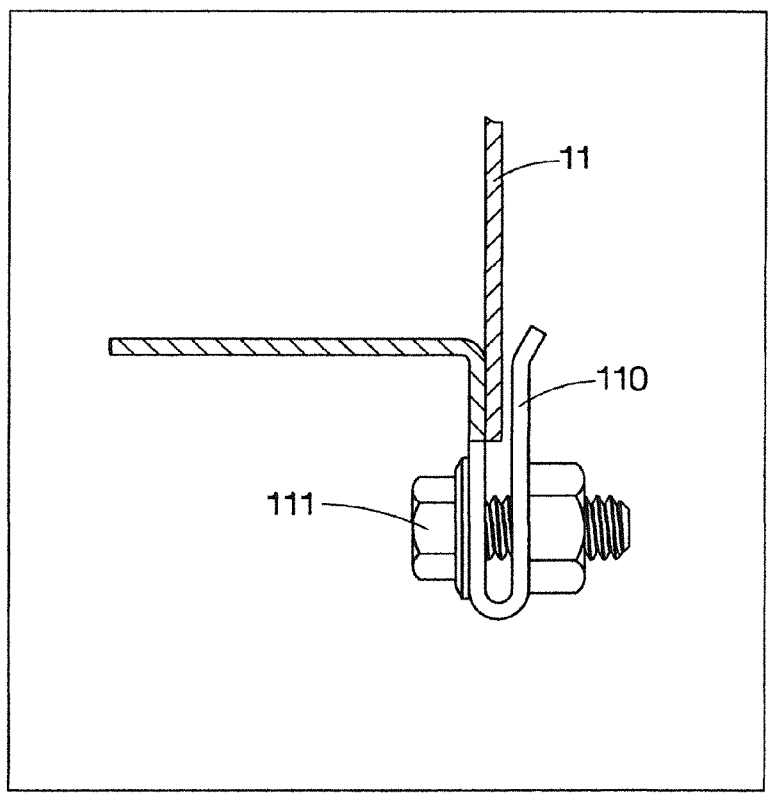
FIG. 14 is a cross-sectional view taken along the line A-A of FIG. 13.
Figure 15:
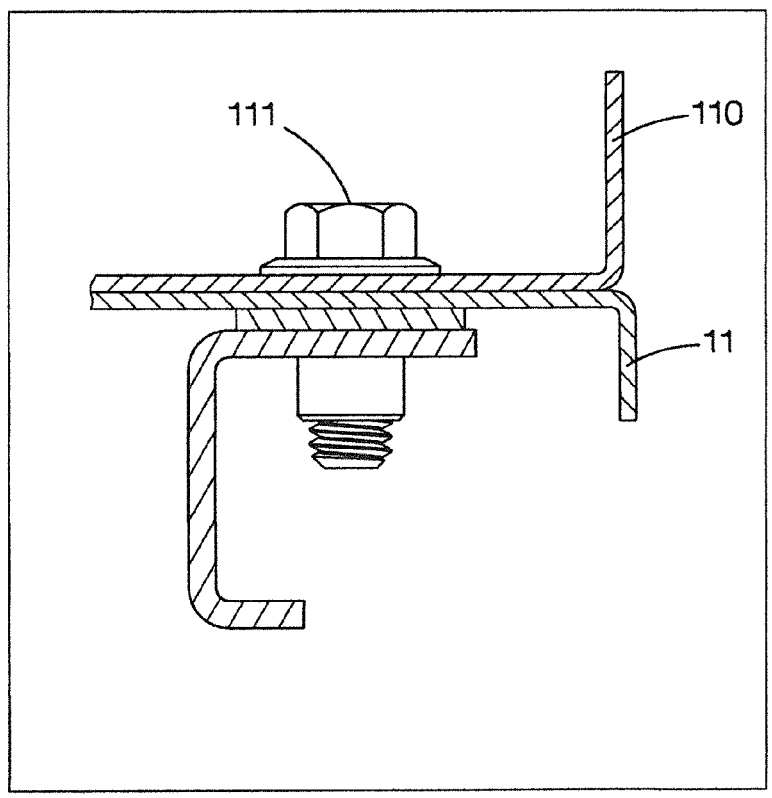
FIG. 15 is a cross-sectional view taken along the line B-B of FIG. 13.

As best seen in FIG. 13, duct bottom 110 may be secured to a top cap 11 of the network cabinet, for example, using one or more fasteners 111, such as serrated head screws, to ground the network cabinet and the duct bottom 110 together (see FIGS. 14 and 15). As such, a grounding whip is not required.

In operation, an installer begins with exhaust duct 100 in the retracted vertical position (see FIG. 1). The installer raises inner duct section 130 to the extended vertical position (see FIG. 2) and secures inner duct section 130 to outer duct section 120, as described above. Next, the installer raises top collar 140 to the extended vertical position (see FIG. 3) and secures top collar 140 to inner duct section 130, as described above, to seal the vertical gap between the network cabinet and the exhaust air plenum in the data center room. Gaskets 149 further seal the vertical gap between the network cabinet and the exhaust air plenum in the data center room.

Figure 16:
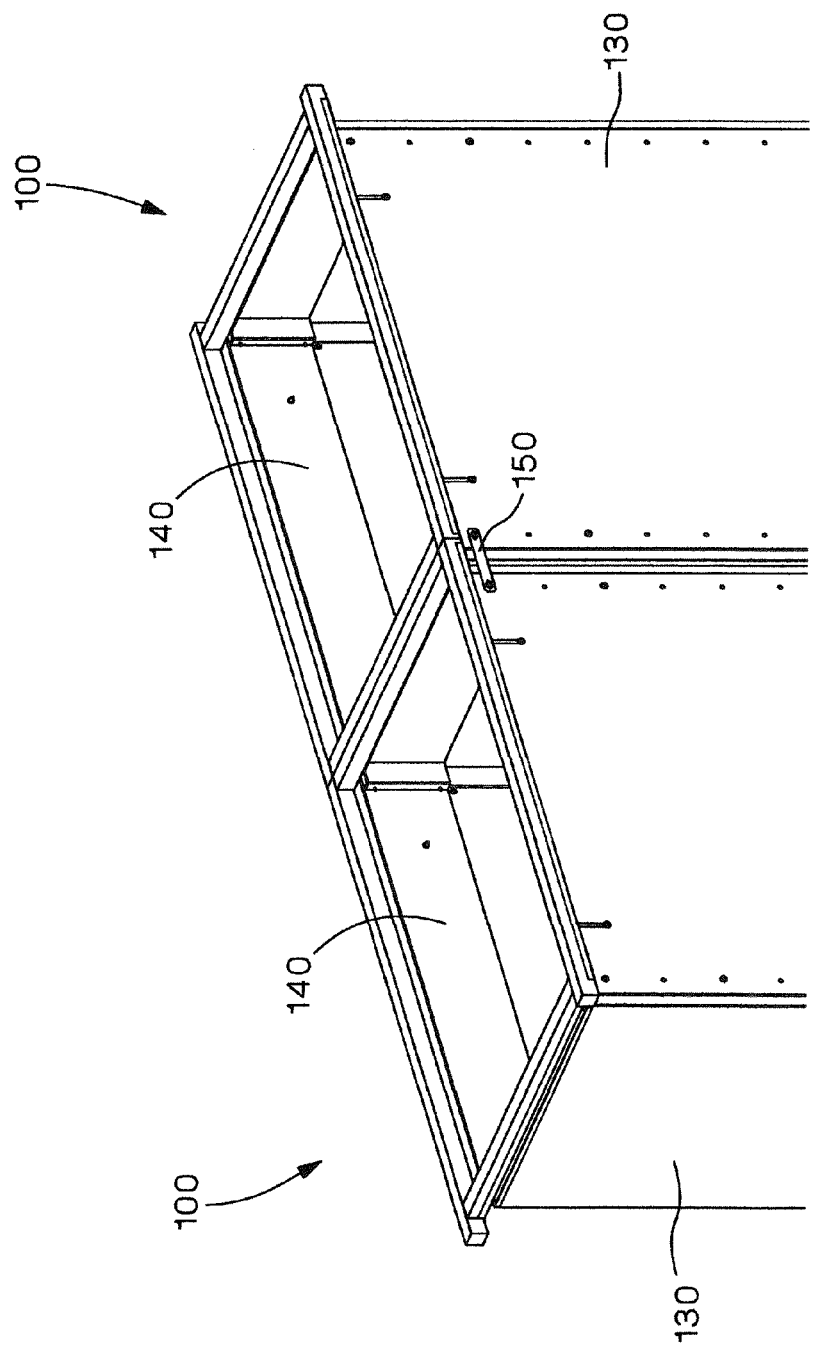
FIG. 16 is a partial perspective view of two adjacent network cabinets, each of which includes the adjustable vertical exhaust duct of FIG. 2.
Figure 17:
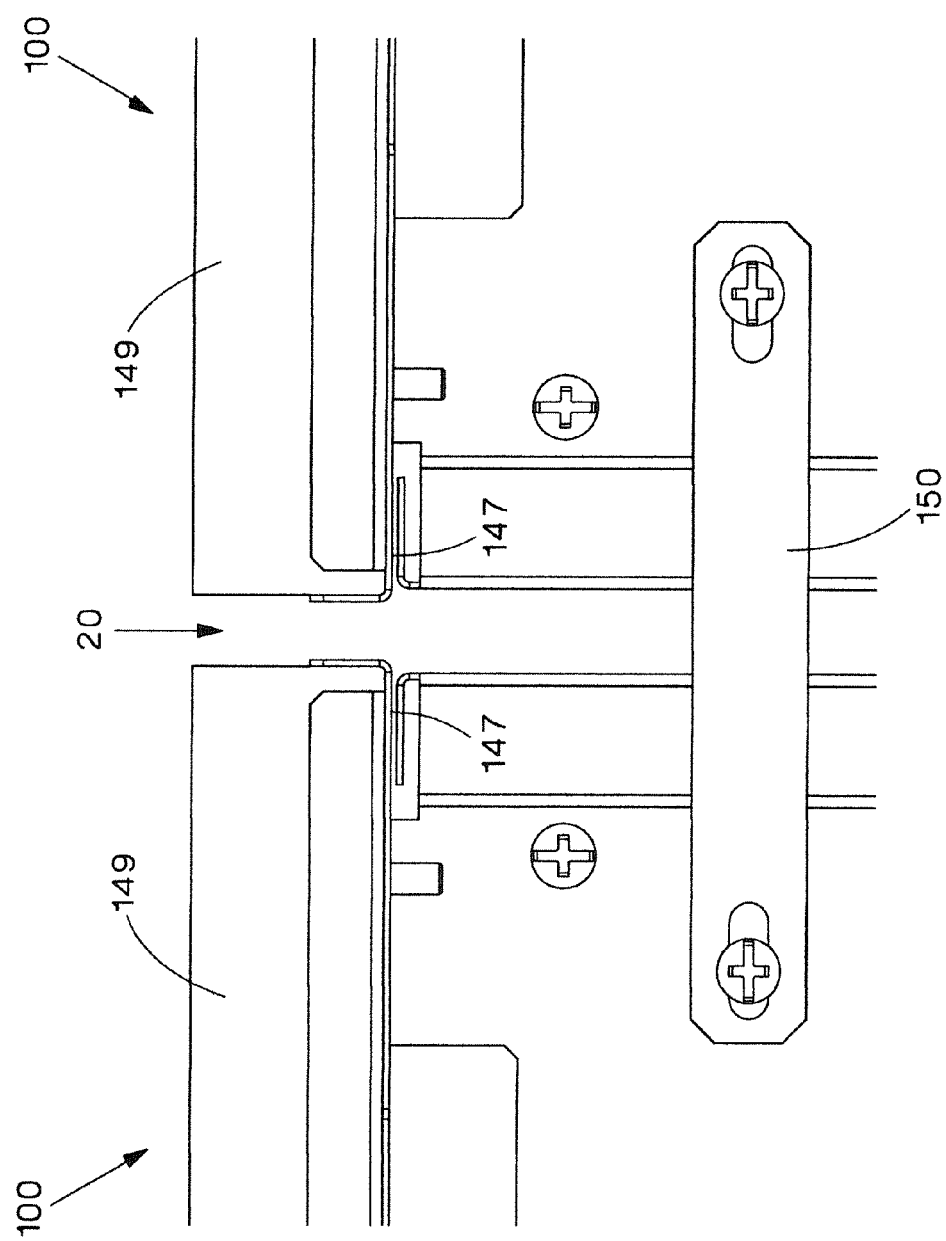
FIG. 17 is a partial side view of the two adjacent adjustable vertical exhaust ducts of FIG. 16, wherein the top collars are in the retracted horizontal position and a gap exists between the adjacent assemblies.
Figure 18:
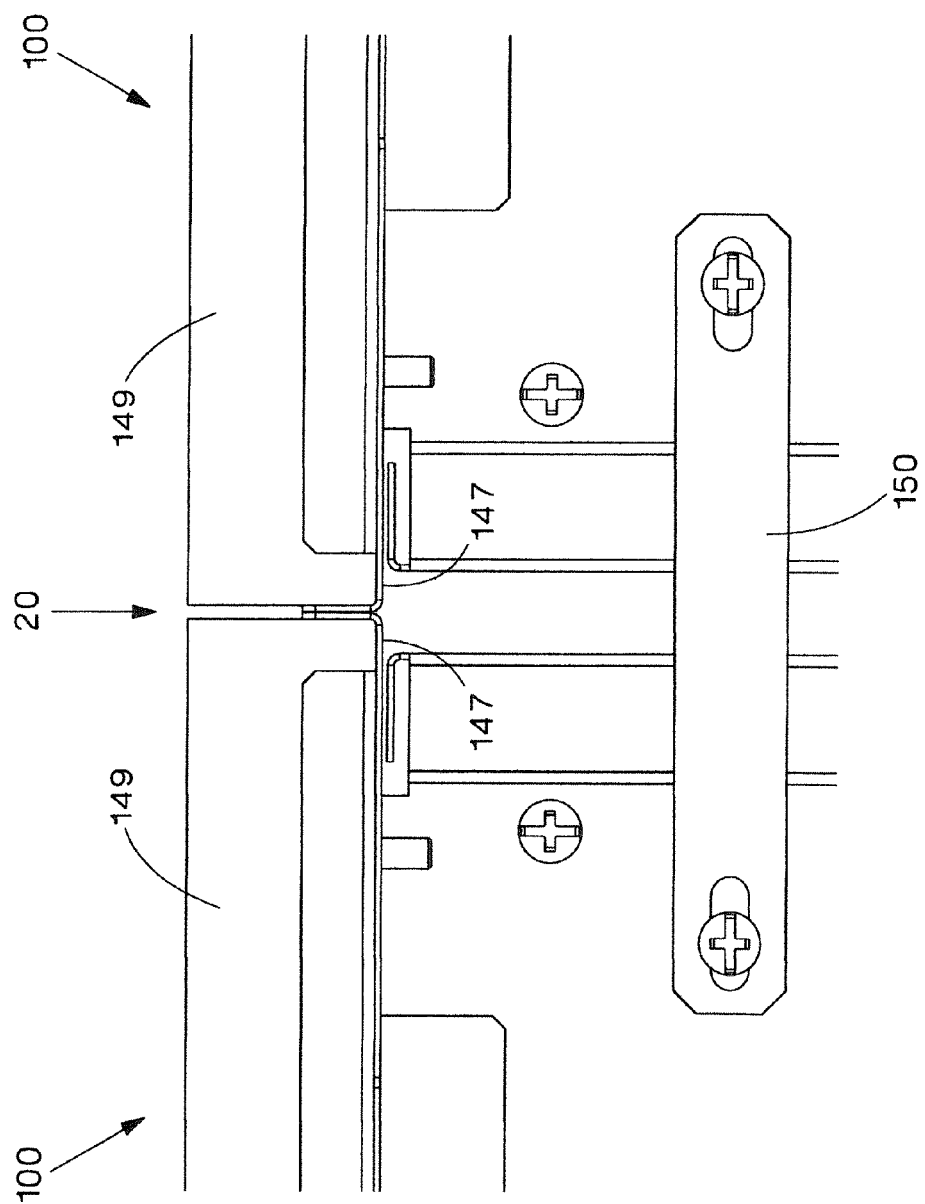
FIG. 18 is a partial side view of the two adjacent adjustable vertical exhaust ducts of FIG. 16, wherein the top collars are in the extended horizontal position and the gap is sealed between the adjacent assemblies.

In the case of adjacent network cabinets, inner duct sections 130 of adjacent exhaust ducts 100 may be connected using one or more optional ganging brackets 150 (see FIG. 16). Additionally or in the alternative, side flanges 147 may be slid from the retracted horizontal position (see FIG. 17) to the extended horizontal position (see FIG. 18) to seal horizontal gap 20 between adjacent exhaust ducts 100.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

The invention claimed is:

1. A vertical exhaust duct for an electronic equipment enclosure, the vertical exhaust duct comprising:
   a first duct section;
   a second duct section slidably connected to the first duct section and extendable to a first plurality of heights above the first duct section; and a third duct section slidably connected to the second duct section and extendable to a second plurality of heights above the second duct section, wherein the first duct section comprises a first plurality of elongated openings for securing the second duct section to the first duct section at any of the first plurality of heights, and wherein the second duct section comprises a second plurality of elongated openings for securing the third duct section to the second duct section at any of the second plurality of heights, further comprising a first side flange slidably connected to the third duct section and extendable to a first position adjacent a first side of the third duct section for sealing a first gap between the vertical exhaust duct and a first adjacent vertical exhaust duct.

2. The vertical exhaust duct of claim 1, wherein the first plurality of elongated openings comprises a first elongated opening having a first length and a second elongated opening having a second length that is longer than the first length.

3. The vertical exhaust duct of claim 1, wherein the second duct section comprises a first plurality of openings aligned with the first plurality of elongated openings.

4. The vertical exhaust duct of claim 3, wherein each of the second plurality of openings comprises a self-clinching nut.

5. The vertical exhaust duct of claim 1, wherein the third duct section comprises a second plurality of openings aligned with the second plurality of elongated openings.

6. The vertical exhaust duct of claim 5, wherein each of the second plurality of openings comprises a self-clinching nut.

7. The vertical exhaust duct of claim 1, wherein the third duct section comprises at least one flange for sealing a gap between the vertical exhaust duct and an exhaust air plenum disposed above the electronic equipment enclosure.

8. The vertical exhaust duct of claim 1, further comprising a second side flange slidably connected to the third duct section and extendable to a second position adjacent a second side of the third duct section for sealing a second gap between the vertical exhaust duct and a second adjacent vertical exhaust duct.

9. The vertical exhaust duct of claim 1, further comprising a base for securing the first duct section to the electronic equipment enclosure.

10. A vertical exhaust duct for an electronic equipment enclosure, the vertical exhaust duct comprising:

a first duct section;

a second duct section slidably connected to the first duct section and extendable to a first plurality of heights above the first duct section; and a third duct section slidably connected to the second duct section and extendable to a second plurality of heights above the second duct section, wherein at least one of the first duct section and the second duct section comprises at least one first fastener for securing the second duct section to the first duct section at any of the first plurality of heights, and wherein at least one of the second duct section and the third duct section comprises at least one second fastener for securing the third duct section to the second duct section at any of the second plurality of heights, further comprising a first side flange slidably connected to the third duct section and extendable to a first position adjacent a first side of the third duct section for sealing a first gap between the vertical exhaust duct and a first adjacent vertical exhaust duct.

11. The vertical exhaust duct of claim 10, wherein the third duct section comprises at least one flange for sealing a gap between the vertical exhaust duct and an exhaust air plenum disposed above the electronic equipment enclosure.

12. The vertical exhaust duct of claim 10, further comprising a second side flange slidably connected to the third duct section and extendable to a second position adjacent a second side of the third duct section for sealing a second gap between the vertical exhaust duct and a second adjacent vertical exhaust duct.

13. The vertical exhaust duct of claim 10, further comprising a base for securing the first duct section to the electronic equipment enclosure.

\* \* \* \* \*